(12) United States Patent
Miyaishi et al.

(10) Patent No.: US 12,195,641 B2
(45) Date of Patent: Jan. 14, 2025

(54) CORROSION-RESISTANT MEMBER

(71) Applicant: SHOWA DENKO K.K., Tokyo (JP)

(72) Inventors: So Miyaishi, Tokyo (JP); Masahiro Okubo, Tokyo (JP); Masayuki Yoshimura, Tokyo (JP); Wataru Sakane, Tokyo (JP); Teppei Tanaka, Tokyo (JP); Saeko Nakamura, Tokyo (JP); Saori Yamaki, Tokyo (JP)

(73) Assignee: Resonac Corporation, Tokyo (JP)

( * ) Notice: Subject to any disclaimer, the term of this patent is extended or adjusted under 35 U.S.C. 154(b) by 435 days.

(21) Appl. No.: 17/612,871

(22) PCT Filed: Feb. 24, 2021

(86) PCT No.: PCT/JP2021/006944
§ 371 (c)(1),
(2) Date: Nov. 19, 2021

(87) PCT Pub. No.: WO2021/182107
PCT Pub. Date: Sep. 16, 2021

(65) Prior Publication Data
US 2022/0243072 A1 Aug. 4, 2022

(30) Foreign Application Priority Data
Mar. 11, 2020 (JP) .................. 2020-042384

(51) Int. Cl.
*C09D 5/08* (2006.01)
*C09D 1/00* (2006.01)
(Continued)

(52) U.S. Cl.
CPC .............. *C09D 5/084* (2013.01); *C09D 1/00* (2013.01); *C23C 14/0694* (2013.01); *C23C 28/04* (2013.01)

(58) Field of Classification Search
None
See application file for complete search history.

(56) References Cited

U.S. PATENT DOCUMENTS 5,811,195 A * 9/1998 Bercaw .................... C23C 8/02
427/255.393
6,357,385 B1 * 3/2002 Ohmi .................. H01J 37/3244
118/723 AN
(Continued)

FOREIGN PATENT DOCUMENTS

CN 105925857 A 9/2016
CN 107164665 A 9/2017
(Continued)

OTHER PUBLICATIONS

International Search Report dated Apr. 27, 2021 in Application No. PCT/JP2021/006944.

*Primary Examiner* — Tamra L. Dicus
(74) *Attorney, Agent, or Firm* — Sughrue Mion, PLLC (57) ABSTRACT

A corrosion-resistant member including: a metal base material (10); and a corrosion-resistant coating (30) formed on the surface of the base material (10). The corrosion-resistant coating (30) is a stack of a magnesium fluoride layer (31) and an aluminum fluoride layer (32) in order from the base material (10) side. The aluminum fluoride layer (32) has a first crystalline region (32A) and a second crystalline region (32B) containing crystalline aluminum fluoride. The first crystalline region (32A) is a region in which diffraction spot arrays having regularity are observed in an electron beam diffraction image obtained by irradiation with electron beams having a beam diameter of 10 nm to 20 nm. The second crystalline region (32B) is a region in which a plurality of diffraction spots is observed but diffraction spot arrays having regularity are not observed in an electron
(Continued)

beam diffraction image obtained by irradiation with the above-described electron beams.

11 Claims, 4 Drawing Sheets

(51) Int. Cl.
  *C23C 14/06* (2006.01)
  *C23C 28/04* (2006.01)

(56) References Cited

U.S. PATENT DOCUMENTS

| | | | |
|---|---|---|---|
| 11,901,175 B2 * | 2/2024 | Shero | H01L 21/0217 |
| 2002/0179192 A1 | 12/2002 | Aihara et al. | |
| 2003/0148035 A1 | 8/2003 | Lingampalli | |
| 2005/0156063 A1 | 7/2005 | Tsuji et al. | |
| 2012/0251746 A1 * | 10/2012 | Chang | C23C 14/0036 |
| | | | 204/192.15 |
| 2015/0017463 A1 | 1/2015 | Harada et al. | |
| 2019/0185999 A1 * | 6/2019 | Shanbhag | C23C 16/4405 |
| 2021/0317551 A1 | 10/2021 | Murase | |

FOREIGN PATENT DOCUMENTS

| | | |
|---|---|---|
| CN | 109439971 A | 3/2019 |
| JP | 4-66657 A | 3/1992 |
| JP | 9-176772 A | 7/1997 |
| JP | 11-61410 A | 3/1999 |
| JP | 2000-219574 A | 8/2000 |
| JP | 2001-40464 A | 2/2001 |
| JP | 2005-209771 A | 8/2005 |
| JP | 2005-533368 A | 11/2005 |
| JP | 2013-177670 A | 9/2013 |
| WO | 2020/008704 A1 | 1/2020 |

* cited by examiner

CORROSION-RESISTANT MEMBER

CROSS REFERENCE TO RELATED APPLICATIONS

This application is a National Stage of International Application No. PCT/JP2021/006944 filed Feb. 24, 2021, claiming priority based on Japanese Patent Application No. 2020-042384 filed Mar. 11, 2020.

TECHNICAL FIELD

The present invention relates to a corrosion-resistant member.

BACKGROUND ART

In a semiconductor manufacturing process, highly corrosive gases, such as chlorine gas and fluorine gas, are sometimes used, and therefore members constituting a semiconductor manufacturing apparatus are required to have corrosion resistance. Examples of the members constituting the semiconductor manufacturing apparatus include chambers, pipes, gas storage devices, valves, susceptors, shower heads, and the like.

PTL 1 discloses a member, such as a shower head, used in a semiconductor manufacturing process. This member has an aluminum surface coated with a corrosion-resistant coating composed of at least one of aluminum fluoride and magnesium fluoride.

PTL 2 discloses a vacuum chamber member obtained by forming a corrosion-resistant coating on the surface of a base material. The surface side of the corrosion-resistant coating is a layer mainly containing aluminum oxide or a layer mainly containing aluminum oxide and aluminum fluoride. The base material side of the corrosion-resistant coating is a layer mainly containing magnesium fluoride or a layer mainly containing magnesium fluoride and aluminum oxide.

CITATION LIST

Patent Literature

PTL 1: JP 2005-533368 A (Translation of PCT Application)
PTL 2: JP 11-61410 A

SUMMARY OF INVENTION

Technical Problem

However, the members disclosed in PTLS 1, 2 have had a problem that the corrosion-resistant coatings are likely to peel off from the base material due to a thermal history.

It is an object of the present invention to provide a corrosion-resistant member in which a corrosion-resistant coating is difficult to peel off from a base material even when subjected to a thermal history.

Solution to Problem

In order to solve the above-described problem, one aspect of the present invention is as described in [1] to [5] below.
[1] A corrosion-resistant member including: a metal base material; and a corrosion-resistant coating formed on the surface of the base material, in which
    the corrosion-resistant coating is a stack of a magnesium fluoride layer containing magnesium fluoride and an aluminum fluoride layer containing aluminum fluoride in order from the base material side,
    the aluminum fluoride layer has a first crystalline region and a second crystalline region containing crystalline aluminum fluoride,
    the first crystalline region is a region in which diffraction spot arrays having regularity are observed in an electron beam diffraction image obtained by irradiation with electron beams having a beam diameter of 10 nm or more and 20 nm or less, and
    the second crystalline region is a region in which a plurality of diffraction spots is observed but diffraction spot arrays having regularity are not observed in an electron beam diffraction image obtained by irradiation with the electron beams.
[2] The corrosion-resistant member according to [1], in which the first crystalline region is arranged adjacent to or close to the magnesium fluoride layer.
[3] The corrosion-resistant member according to [1] or [2], in which the metal base material is formed of aluminum or an aluminum alloy.
[4] The corrosion-resistant member according to any one of [1] to [3], in which the thickness of the magnesium fluoride layer is 0.1 µm or more and 20 µm or less.
[5] The corrosion-resistant member according to any one of [1] to [4], in which the thickness of the aluminum fluoride layer is 0.2 µm or more and 50 µm or less.

Advantageous Effects of Invention

In the corrosion-resistant member according to the present invention, the corrosion-resistant coating is difficult to peel off from the base material even when subjected to a thermal history.

DESCRIPTION OF EMBODIMENTS

One embodiment of the present invention will now be described below. This embodiment describes an example of the present invention, and the present invention is not limited to this embodiment. Further, this embodiment can be variously altered or modified and embodiments obtained by such alternations or modifications may also be included in the present invention.

Figure 1:
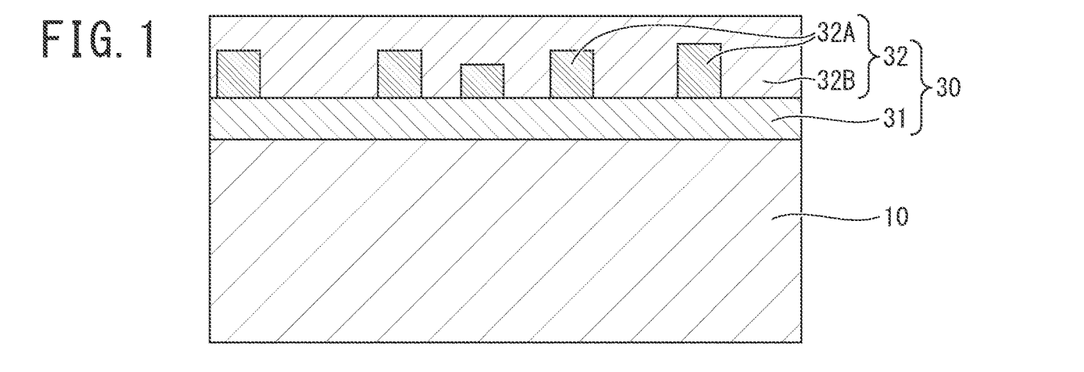
FIG. 1 is a schematic cross-sectional view illustrating the configuration of a corrosion-resistant member according to one embodiment of the present invention.

As illustrated in FIG. 1, a corrosion-resistant member according to this embodiment includes a metal base material 10 and a corrosion-resistant coating 30 formed on the surface of the base material 10. The corrosion-resistant coating 30 is a stack of a magnesium fluoride layer 31 containing magnesium fluoride ($MgF_2$) and an aluminum fluoride layer 32 containing aluminum fluoride ($AlF_3$) in order from the base material 10 side.

As illustrated in FIG. 1, the aluminum fluoride layer 32 further has first crystalline regions 32A containing crystalline aluminum fluoride and second crystalline regions 32B containing crystalline aluminum fluoride.

The first crystalline region 32A is a region win which diffraction spot arrays having regularity are observed in an electron beam diffraction image obtained by irradiation with electron beams having a beam diameter of 10 nm or more and 20 nm or less. The second crystalline region 32B is a region in which a plurality of diffraction spots is observed but diffraction spot arrays having regularity are not observed in an electron beam diffraction image obtained by irradiation with the electron beams having a beam diameter of 10 nm or more and 20 nm or less.

Figure 2:
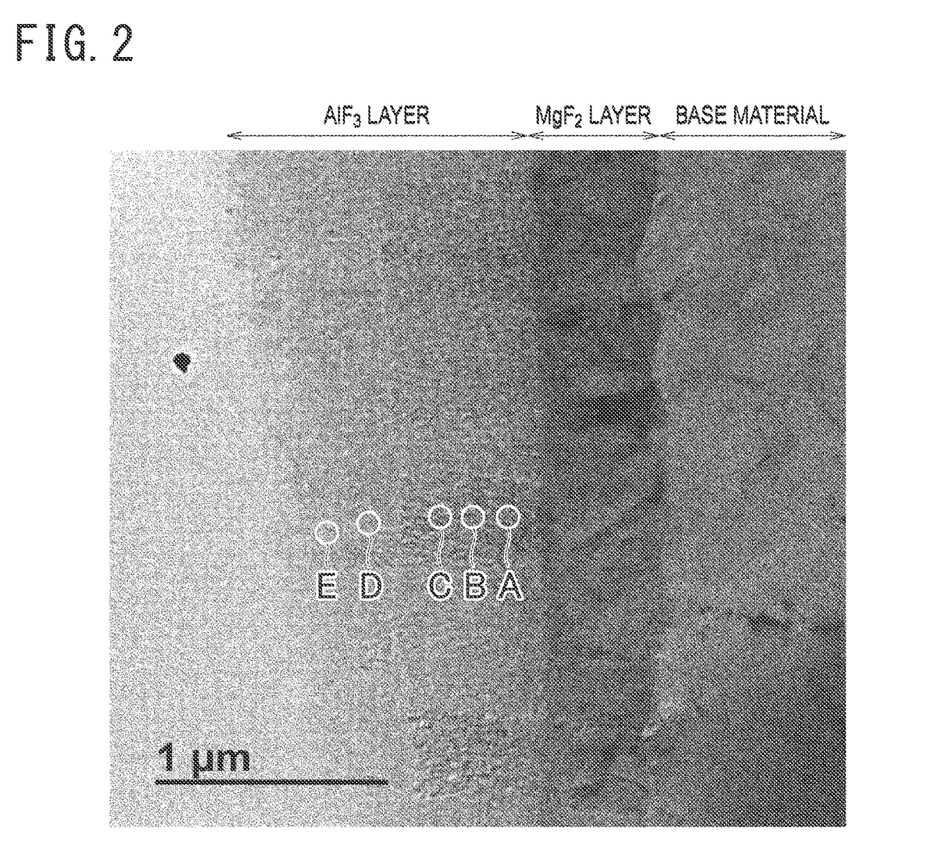
FIG. 2 is a transmission electron microscope image (TEM image) of a cross section of the corrosion-resistant member according to one embodiment of the present invention.

FIG. 2 illustrates a TEM image of a cross section of the corrosion-resistant member according to this embodiment. FIG. 1 and FIG. 2 are cross-sectional views when the corrosion-resistant member is cut along a plane along the stacking direction of the magnesium fluoride layer 31 and the aluminum fluoride layer 32. As illustrated in FIG. 2, the aluminum fluoride layer 32 has the first crystalline regions 32A and the second crystalline regions 32B. In the corrosion-resistant member of FIG. 2, an A part, a B part, and a C part on the magnesium fluoride layer 31 side of the aluminum fluoride layer 32 are the first crystalline regions 32A and a D part and an E part on the surface side of the aluminum fluoride layer 32 are the second crystalline regions 32B.

Figure 3:
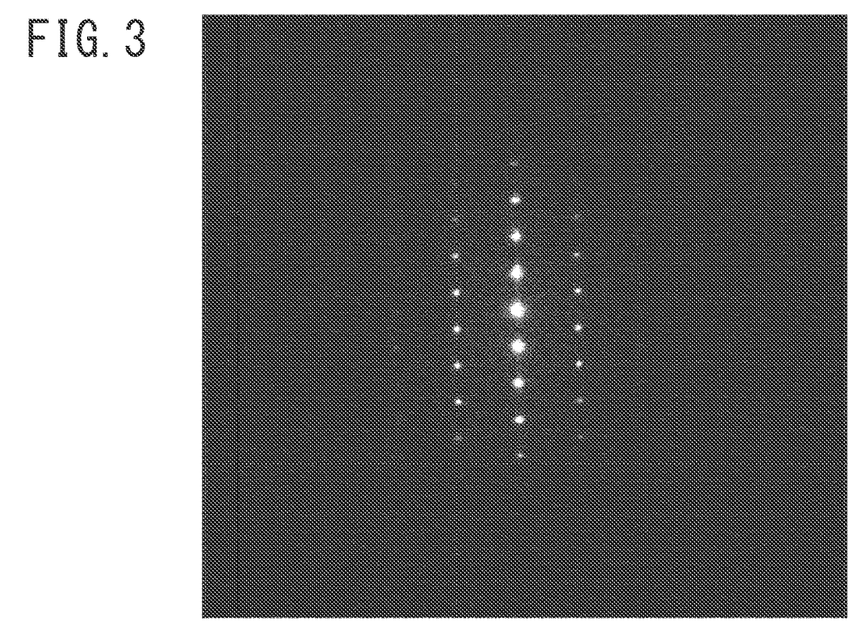
FIG. 3 is an electron beam diffraction image obtained by irradiating an A part (first crystalline region) of an aluminum fluoride layer possessed by the corrosion-resistant member of FIG. 2 with electron beams.

An electron beam diffraction image illustrated in FIG. 3 is an electron beam diffraction image obtained by irradiating the A part of the aluminum fluoride layer 32 possessed by the corrosion-resistant member of FIG. 2 with the above-described electron beams. Similarly, electron beam diffraction images illustrated in FIGS. 4 to 7 are electron beam diffraction images obtained by irradiating the B part to the E part, respectively, of the aluminum fluoride layer 32 possessed by the corrosion-resistant member of FIG. 2 with the above-described electron beams.

Figure 4:
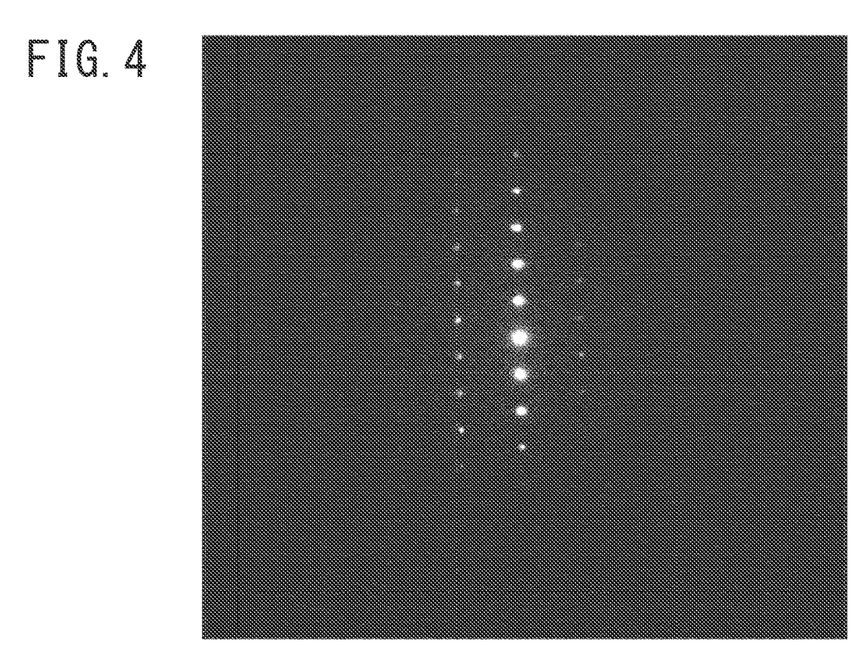
FIG. 4 is an electron beam diffraction image obtained by irradiating a B part (first crystalline region) of the aluminum fluoride layer possessed by the corrosion-resistant member of FIG. 2 with electron beams.
Figure 5:
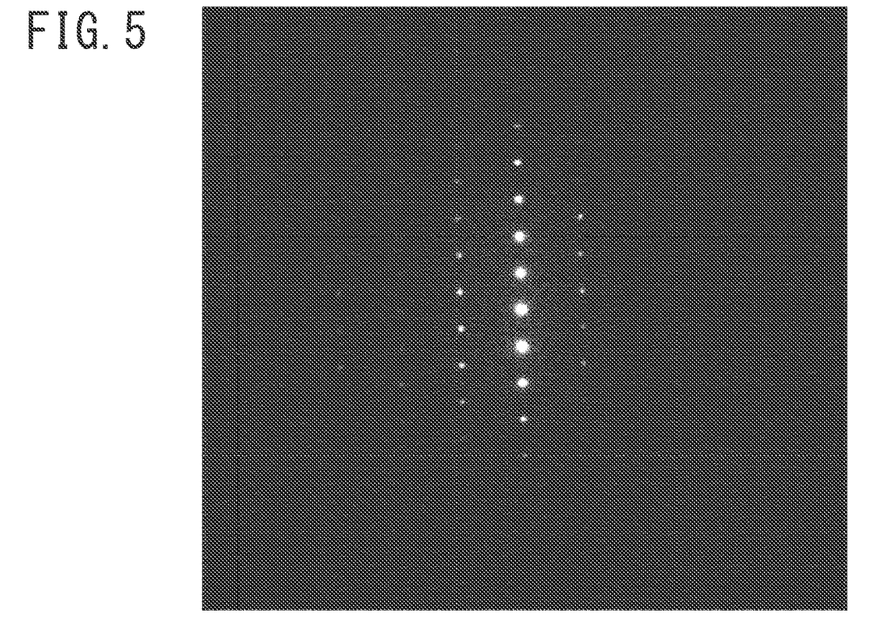
FIG. 5 is an electron beam diffraction image obtained by irradiating a C part (first crystalline region) of the aluminum fluoride layer possessed by the corrosion-resistant member of FIG. 2 with electron beams.

As is understood from the electron beam diffraction images of FIGS. 3 to 5, diffraction spot arrays having regularity are observed in the electron beam diffraction images obtained by irradiating the A part, the B part, and the C part of the aluminum fluoride layer 32 with the electron beams having a beam diameter of 10 nm or more and 20 nm or less. As is understood from the electron beam diffraction images of FIGS. 6, 7, a plurality of diffraction spots is observed but diffraction spot arrays having regularity are not observed in the electron beam diffraction images obtained by irradiating the D part and the E part of the aluminum fluoride layer 32 with the electron beams having a beam diameter of 10 nm or more and 20 nm or less.

The corrosion-resistant member according to this embodiment includes the corrosion-resistant coating 30, and therefore has excellent corrosion resistance even in highly corrosive gas or plasma. The magnesium fluoride layer 31 is interposed between the aluminum fluoride layer 32 and the base material 10, and therefore the adhesion between the aluminum fluoride layer 32 and the base material 10 is high. Further, the aluminum fluoride layer 32 has the first crystalline regions 32A and the second crystalline regions 32B, and therefore, even when subjected to a thermal history, the corrosion-resistant coating 30 is difficult to peel off from the base material 10 and cracking is difficult to occur. For example, even when subjected to a thermal history in which the temperature is repeatedly raised and lowered, peeling or cracking is difficult to occur in the corrosion-resistant coating 30. As a result, the corrosion-resistant member according to this embodiment has excellent corrosion resistance even when subjected to a thermal history and the generation of particles resulting from the peeling of the corrosion-resistant coating 30 is suppressed.

Such a corrosion-resistant member according to this embodiment is suitable as a member requiring corrosion resistance and heat resistance and suitable as a member constituting, for example, a semiconductor manufacturing apparatus (particularly, a film deposition apparatus using a chemical vapor deposition method). As a specific example, the corrosion-resistant member is suitable as a susceptor and a shower head of a film deposition apparatus forming a thin film on a wafer in a state where plasma is generated. The use of the corrosion-resistant member according to this embodiment as the member constituting the semiconductor manufacturing apparatus suppresses the generation of particles, so that a semiconductor can be manufactured with a high yield.

Hereinafter, the corrosion-resistant member according to this embodiment is described in more detail.

[Base Material]

The metal constituting the base material 10 is not particularly limited and may be a simple metal (containing inevitable impurities) or an alloy. For example, aluminum or an aluminum alloy may be acceptable.

[Magnesium Fluoride Layer]

The thickness of the magnesium fluoride layer 31 is preferably 0.1 μm or more and 20 μm or less, more preferably 0.15 μm or more and 10 μm or less, and further preferably 0.2 μm or more and 7 μm or less. When the thickness of the magnesium fluoride layer 31 is 0.1 μm or more, the adhesion between the aluminum fluoride layer 32 and the base material 10 is further enhanced. Therefore, even when subjected to a thermal history, the corrosion-resistant coating 30 is difficult to peel off from the base material 10. When the thickness of the magnesium fluoride layer 31 is 20 μm or less, cracking is difficult to occur in the magnesium fluoride layer 31 even when subjected to a thermal history.

Examples of a method for measuring the thickness of the magnesium fluoride layer 31 include, but not particularly limited to, a transmission electron microscope (TEM), a scanning transmission electron microscope (STEM), a scanning electron microscope (SEM), and the like, for example. The thickness of the magnesium fluoride layer 31 can be measured by obtaining a TEM image using a transmission electron microscope and confirming the boundary between the magnesium fluoride layer 31 and an adjacent layer in the TEM image based on the gradation of the image, for example. The thickness of each of the aluminum fluoride layer 32, the first crystalline regions 32A, and the second crystalline regions 32B can also be measured by a method similar to the above-described method.

Quantitative analysis methods of elements, such as fluorine and magnesium, possessed by the magnesium fluoride layer 31 are not particularly limited and the elements can be analyzed by, for example, energy dispersive X-ray analysis (EDS analysis) or electron probe micro analyzer analysis (EPMA analysis).

[Aluminum Fluoride Layer]

The aluminum fluoride contained in the aluminum fluoride layer 32 may be at least one selected from aluminum fluoride ($AlF_3$), aluminum fluoride hydrate ($AlF_3 \cdot nH_2O$), aluminum fluoride containing a part of a hydroxyl group ($AlF_{3-x}(OH)_x$), aluminum fluoride hydrate containing a part of a hydroxyl group ($AlF_{3-x}(OH)_x \cdot nH_2O$), aluminum fluoride containing a part of oxygen ($AlF_{3(1-x)}O_{3/2x}$), and aluminum fluoride hydrate containing a part of oxygen ($AlF_{3(1-x)}O_{3/2x} \cdot nH_2O$).

The thickness of the aluminum fluoride layer 32 is preferably 0.2 μm or more and 50 μm or less, more preferably 0.3 μm or more and 40 μm or less, and further preferably 0.5 μm or more and 30 μm or less. When the thickness of the aluminum fluoride layer 32 is within the ranges above, the corrosion resistance of the corrosion-resistant coating 30 is further excellent and cracking is difficult to occur in the aluminum fluoride layer 32 even when subjected to a thermal history. A method for measuring the thickness of the aluminum fluoride layer 32 is as described above in the section of the magnesium fluoride layer.

Quantitative analysis methods of elements, such as fluorine and aluminum, possessed by the aluminum fluoride layer 32 are not particularly limited and the elements can be analyzed by, for example, energy dispersive X-ray analysis or electron probe micro analyzer analysis (EPMA analysis).

[First Crystalline Region and Second Crystalline Region]

The first crystalline region 32A is the region in which the diffraction spot arrays having regularity are observed in the electron beam diffraction image obtained by irradiation with the electron beams having a beam diameter of 10 nm or more and 20 nm or less. The "diffraction spot arrays having regularity" are described in detail below. More specifically, the electron beam diffraction image is constituted such that two or more of the diffraction spot arrays are arranged so as to form a point-symmetric figure with a diffraction spot located at the center of the electron beam diffraction image as the center of symmetry of the point symmetry. The diffraction spot array is an array in which three or more diffraction spots are linearly arranged at equal intervals. The "diffraction spot arrays having regularity" in the present invention mean the diffraction spot arrays arranged as described above.

FIGS. 3 to 5 are the electron beam diffraction images obtained by irradiating the A part, the B part, and the C part, respectively, of the aluminum fluoride layer 32 possessed by the corrosion-resistant member of FIG. 2 with the electron beams having a beam diameter of 10 nm or more and 20 nm or less, in which three arrays are arranged in parallel, each array having three or more diffraction spots linearly arranged at equal intervals. The diffraction spots constituting the outer two arrays sandwiching the center array are arranged so as to form a point-symmetric figure with the diffraction spot located at the center of the electron beam diffraction image (diffraction spot located at the center of the center array) as the center of the symmetry of the point symmetry. Therefore, the A part, the B part, and the C part of the aluminum fluoride layer 32 are the first crystalline regions 32A.

The second crystalline region 32B is a region in which a plurality of diffraction spots is observed but the diffraction spot arrays having regularity, which are observed in the first crystalline region 32A, are not observed in the electron beam diffraction image obtained by irradiation with the electron beams having a beam diameter of 10 nm or more and 20 nm or less.

Figure 6:
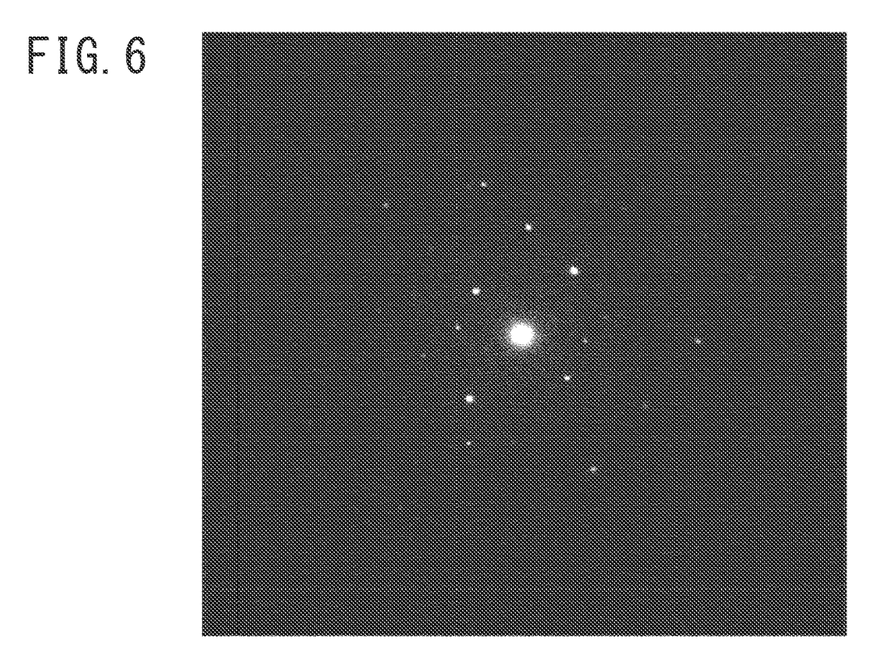
FIG. 6 is an electron beam diffraction image obtained by irradiating a D part (second crystalline region) of the aluminum fluoride layer possessed by the corrosion-resistant member of FIG. 2 with electron beams.
Figure 7:
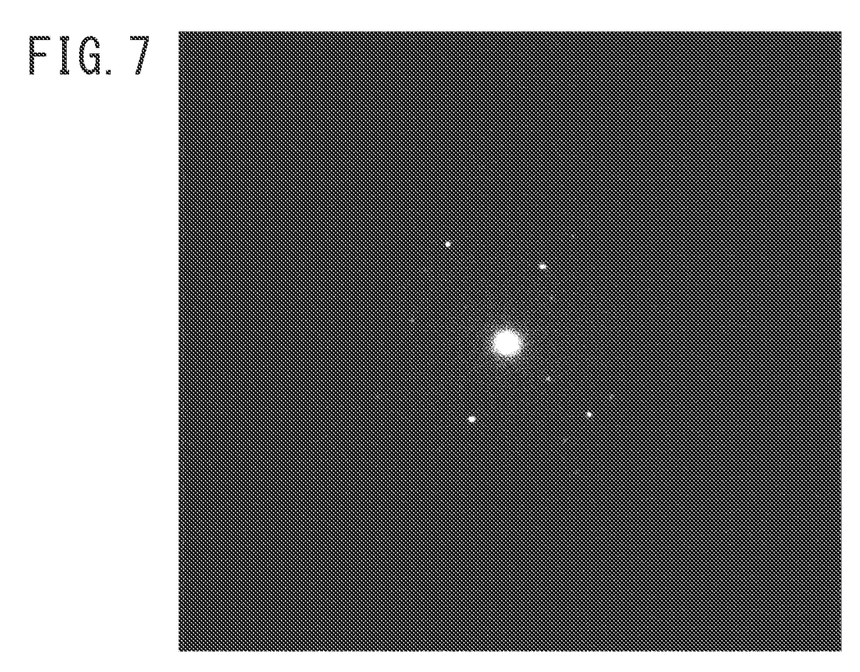
FIG. 7 is an electron beam diffraction image obtained by irradiating an E part (second crystalline region) of the aluminum fluoride layer possessed by the corrosion-resistant member of FIG. 2 with electron beams.

FIGS. 6, 7 are the electron beam diffraction images obtained by irradiating the D part and the E part of the aluminum fluoride layer 32 possessed by the corrosion-resistant member of FIG. 2 with the electron beams having a beam diameter of 10 nm or more and 20 nm or less, in which a plurality of diffraction spots is observed but the diffraction spot arrays having regularity are not observed. Therefore, the D part and the E part of the aluminum fluoride layer 32 are the second crystalline regions 32B.

The fact that the above-described point-symmetric figure is observed in the electron beam diffraction image means that single crystals or polycrystals composed of a plurality of crystals arranged in the same direction are present in an area corresponding to the beam diameter of the electron beam. In contrast thereto, a case where the above-described point-symmetric figure is not observed even when the plurality of diffraction spots is observed in the electron beam diffraction image means that polycrystals composed of a plurality of crystals arranged in different directions are present in an area corresponding to the beam diameter of the electron beam.

More specifically, it is meant that single crystals or polycrystals composed of a plurality of crystals arranged in the same direction are present in the first crystalline regions 32A and polycrystals composed of a plurality of crystals arranged in different directions are present in the second crystalline regions 32B.

A method for analyzing the first crystalline region 32A and the second crystalline region 32B is not particularly limited insofar as it is a method capable of obtaining an electron beam diffraction image by irradiation with the electron beams having a beam diameter of 10 nm or more and 20 nm or less. The electron beam irradiation conditions include irradiation at an acceleration voltage of 230 kV using a transmission electron microscope HF-2200 manufactured by Hitachi High-Tech Corporation.

Both the first crystalline region 32A and the second crystalline region 32B may have a layer shape or may be stacked in the aluminum fluoride layer 32. Alternatively, one of the first crystalline region 32A and the second crystalline region 32B may have a massive shape and may be dispersed in the other one (i.e., the aluminum fluoride layer 32 may have a sea-island structure containing the first crystalline regions 32A and the second crystalline regions 32B).

The first crystalline regions 32A are preferably arranged adjacent to or close to the magnesium fluoride layer 31. Such a configuration enhances the adhesion between the magnesium fluoride layer 31 and the aluminum fluoride layer 32.

The ratio of the thickness (length in the stacking direction) of the first crystalline region 32A to the thickness of the aluminum fluoride layer 32 is preferably 5% or more and 95% or less, more preferably 10% or more and 90% or less, and still more preferably 15% or more and 80% or less. Such a configuration enhances the adhesion between the magnesium fluoride layer 31 and the aluminum fluoride layer 32. A method for measuring the thickness of the first crystalline region 32A is as described above in the section of the magnesium fluoride layer.

In the first crystalline regions 32A and the second crystalline regions 32B, the contained aluminum fluoride may be at least partially crystalline and need not be entirely crystalline. The crystalline preferably has a crystal unit having the same crystal orientation and a long side of 300 nm or more. When the long side is 300 nm or more, the adhesion between the magnesium fluoride layer 31 and the aluminum fluoride layer 32 is further enhanced. This crystal unit may be a single crystal or a polycrystal.

[Method for Manufacturing Corrosion-Resistant Member]

Examples of methods for manufacturing the corrosion-resistant member according to this embodiment include, but not particularly limited to, a method including forming an aluminum fluoride layer by vapor deposition or the like on the surface of a base material formed of an aluminum alloy containing magnesium, and then performing heat treatment. The aluminum fluoride layer before the heat treatment contains crystalline aluminum fluoride, but the contained crystalline substances are all equivalent to the crystalline substances of the second crystalline regions and crystalline substances equivalent to the crystalline substances of the first crystalline region are not contained.

When heat treatment is applied in an atmosphere, such as a fluorine gas atmosphere, a magnesium fluoride layer is formed between the base material and the aluminum fluoride layer and a first crystalline region is formed in the aluminum fluoride layer, so that the aluminum fluoride layer is in a state where the first crystalline region and the second crystalline region coexist.

The retention temperature in the heat treatment is preferably 200° C. or higher and 500° C. or lower, more preferably 300° C. or higher and 475° C. or lower, and further preferably 350° C. or higher and 450° C. or lower. When the retention temperature in the heat treatment is 200° C. or higher, the magnesium fluoride layer is likely to be formed. Further, the first crystalline region is likely to be formed in the aluminum fluoride layer. When the retention temperature in the heat treatment is 500° C. or less, cracking is less likely to occur in the aluminum fluoride layer.

The retention time in the heat treatment is preferably 1 hour or more and 250 hours or less, more preferably 3 hours or more and 150 hours or less, and further preferably 5 hours or more and 100 hours or less. When the retention time in the heat treatment is 1 hour or more, the magnesium fluoride layer is likely to be formed. Further, the first crystalline region is likely to be formed in the aluminum fluoride layer. When the retention time in the heat treatment is 250 hours or less, good productivity is likely to be obtained.

EXAMPLES

Hereinafter, the present invention is more specifically described by illustrating Examples and Comparative Examples.

A base material was first subjected to pre-treatment, and then subjected to vacuum deposition, thereby forming an aluminum fluoride layer on the surface of the base material. Thereafter, by performing heat treatment, a magnesium fluoride layer was formed between the base material and the aluminum fluoride layer and a first crystalline region was formed in the aluminum fluoride layer, thereby obtaining a corrosion-resistant member.

Metal constituting the base material is an aluminum alloy A5052 containing 2.55% by mass of magnesium. The base material is a plate with a length of 50 mm, a width of 30 mm, and a thickness of 3 mm.

The pre-treatment to the substrate was performed as follows. First, a degreasing liquid was obtained by dissolving 50 g of U-CLEANER UA68 (manufactured by C. Uyemura & Co., Ltd.), which is an alkaline degreasing liquid containing sodium borate, carbonate, phosphate, and a surfactant, in 1 L of water and setting the temperature to 50° C. Then, the base material was immersed in the degreasing solution for 10 minutes for degreasing, followed by washing with pure water.

Next, an etchant was obtained by heating 500 g of S-CLEAN AL-5000 (manufactured by SASAKI CHEMICAL CO., LTD.) to 70° C. Then, the degreased base material was immersed in the etchant for 1 minute for etching, followed by washing with pure water.

Thereafter, a smut removing liquid was obtained by dissolving 200 g of Smut Clean (manufactured by Raiki K.K.) containing nitric acid in 400 g of water and setting the temperature to 25° C. Then, the etched base material was immersed in the smut removing liquid for 30 seconds for removal of smut, followed by washing with pure water. Then, the base material from which smut was removed was vacuum-dried to complete the pre-treatment.

The conditions of the vacuum deposition in forming the aluminum fluoride layer are as follows. First, the base material subjected to the pre-treatment was installed in a vacuum chamber, and then the inside of the vacuum chamber was evacuated until the degree of vacuum reached $3 \times 10^{-4}$ Pa. An aluminum fluoride sintered body material was used as a vapor deposition material, the sintered body material was irradiated with electron beams, and then a shutter was opened, so that an aluminum fluoride layer having a thickness of 1.1 µm was formed on the base material subjected to the pre-treatment. The electron beam input power at this time was about 40 mA at an acceleration voltage of 5 kV, the degree of vacuum in the vapor deposition was set to $7 \times 10^{-4}$ Pa, and the treatment time was set to 120 sec. This aluminum fluoride layer does not have the first crystalline region and has only the second crystalline region.

The conditions of the heat treatment are as follows. The substrate on which the aluminum fluoride layer was formed was heated to 450° C. in a mixed gas atmosphere of 20% by volume of fluorine gas and 80% by volume of nitrogen gas to be subjected to heat treatment for 50 hours. By the heat treatment, a magnesium fluoride layer having a thickness of 0.5 µm was formed between the base material and the aluminum fluoride layer and the first crystalline region was formed in the aluminum fluoride layer, so that the aluminum fluoride layer was in a state where the first crystalline region and the second crystalline region coexisted. The thickness of the aluminum fluoride layer was 1.1 µm even after the heat treatment. The ratio of the thickness of the first crystalline region (length in the stacking direction) to the thickness of the aluminum fluoride layer was 60%.

Elements, such as magnesium and aluminum, present in the formed magnesium fluoride layer and the formed aluminum fluoride layer were analyzed by the energy dispersive X-ray analysis. In detail, a sample processed to a thickness of 40 nm or more and 100 nm or less with an ion slicer was subjected to a point analysis of each layer at an acceleration voltage of 200 kV to analyze the elements, such as magnesium and aluminum.

The presence of the first crystalline region and the second crystalline region in the aluminum fluoride layer was confirmed by the electron beam diffraction method. In detail, a sample processed to a thickness of 40 nm or more and 100 nm or less with an ion slicer was irradiated with the electron beams having a beam diameter of 10 nm or more and 20 nm or less, and an electron beam diffraction image was obtained by the TEM. The electron beam diffraction images of the first crystalline region and the second crystalline region are individually illustrated in FIGS. 3 to 7.

The electron beam diffraction image illustrated in FIG. 3 is an electron beam diffraction image obtained by irradiating the A part of the aluminum fluoride layer 32 possessed by the corrosion-resistant member of FIG. 2 with the above-described electron beams. The A part is a part at a position in the stacking direction corresponding to a thickness of 13% from the base material 10 side with respect to the thickness of the aluminum fluoride layer 32. The electron beam diffraction images illustrated in FIGS. 4 to 7 are electron beam diffraction images obtained by irradiating the B part to the E part of the aluminum fluoride layer 32 possessed by the corrosion-resistant member of FIG. 2 with the above-described electron beams, in which, as with the A part, the B part is a part at a position in the stacking direction corresponding to a thickness of 29%, the C part is a part at a position in the stacking direction corresponding to a thickness of 44%, the D part is a part at a position in the stacking direction corresponding to a thickness of 72%, and the E part is a part at a position in the stacking direction corresponding to a thickness of 92%.

The obtained corrosion-resistant member of Example 1 was subjected to a heating test, thereby evaluating the state of peeling of the corrosion-resistant coating. The conditions of the heating test are as follows: a step of keeping the corrosion-resistant member at 350° C. for 300 min in a nitrogen gas atmosphere, and then naturally cooling the corrosion-resistant member to an ambient temperature was set as one cycle, and 10 cycles were performed.

After the heating test was completed, the corrosion-resistant coating of the corrosion-resistant member was observed with a scanning electron microscope, thereby evaluating the degree of peeling. The results are shown in Table 1. In Table 1, a case where the area of a peeled part of the corrosion-resistant coating was less than 1% of the area of the corrosion-resistant coating is indicated by SA, a case where the area was 1% or more and less than 5% is indicated by A, a case where the area was 5% or more and less than 30% is indicated by B, and a case where the area was 30% or more is indicated by C.

Example 2

A corrosion-resistant member was manufactured and evaluated in the same manner as in Example 1, except that the metal constituting the base material was changed to an aluminum alloy A6061 containing 1.02% by mass of magnesium. The results are shown in Table 1.

Example 3

A corrosion-resistant member was manufactured and evaluated in the same as in Example 1, except that the treatment time of the vacuum deposition in forming the aluminum fluoride layer on the base material subjected to the pre-treatment was set to 70 min. The results are shown in Table 1.

Example 4

A corrosion-resistant member was manufactured and evaluated in the same as in Example 1, except that the treatment time of the vacuum deposition in forming the aluminum fluoride layer on the base material subjected to the pre-treatment was set to 45 sec. The results are shown in Table 1.

Example 5

A corrosion-resistant member was manufactured and evaluated in the same manner as in Example 1, except that the conditions of the heat treatment were set as follows: the retention temperature was set to 470° C. and the retention time was set to 200 hours. The results are shown in Table 1.

Example 6

A corrosion-resistant member was manufactured and evaluated in the same manner as in Example 1, except that the conditions of the heat treatment were set as follows: the retention temperature was set to 400° C. and the retention time was set to 20 hours. The results are shown in Table 1.

Comparative Example 1

A corrosion-resistant member was manufactured and evaluated in the same manner as in Example 1 except that the conditions of the vacuum deposition in forming the aluminum fluoride layer on the base material subjected to the pre-treatment were changed as described below and the heat treatment was not performed after forming the aluminum fluoride layer on the surface of the base material. The results are shown in Table 1.

Since the heat treatment was not performed, the corrosion-resistant member in Comparative Example 1 does not have the magnesium fluoride layer. Further, since the heat

TABLE 1

|  | | Thickness of magnesium fluoride layer (μm) | Aluminum fluoride layer | | | | |
| --- | --- | --- | --- | --- | --- | --- | --- |
|  | Aluminum alloy | | Thickness (μm) | First crystalline region | Second crystalline region | Thickness of first crystalline region (%)* | Degree peeling of corrosion-resistant coating |
| Ex. 1 | A5052 | 0.5 | 1.1 | Presence | Presence | 60 | SA |
| Ex. 2 | A6061 | 0.5 | 1.1 | Presence | Presence | 60 | SA |
| Ex. 3 | A5052 | 0.5 | 37 | Presence | Presence | 15 | A |
| Ex. 4 | A5052 | 0.5 | 0.4 | Presence | Presence | 90 | A |
| Ex. 5 | A5052 | 8 | 1.1 | Presence | Presence | 95 | A |
| Ex. 6 | A5052 | 0.2 | 1.1 | Presence | Presence | 45 | SA |
| Comp. Ex. 1 | A5052 | — | 1.1 | Absence | Presence | — | C |
| Comp. Ex. 2 | A5052 | 0.5 | 1.1 | Absence | Presence | — | B |
| Comp. Ex. 3 | A6061 | — | 1.1 | Absence | Presence | — | C |
| Comp. Ex. 4 | A6061 | 0.5 | 1.1 | Absence | Presence | — | B |

*Ratio of the thickness of the first crystalline region to the thickness of the aluminum fluoride layer treatment was not performed, the corrosion-resistant member in Comparative Example 1 does not have the first crystalline region in the aluminum fluoride layer and the aluminum fluoride layer was composed of only the second crystalline region.

The conditions of the vacuum deposition in Comparative Example 1 are as follows. First, the base material subjected to the pre-treatment was installed in a vacuum chamber, and then the inside of the vacuum chamber was evacuated until the degree of vacuum reached $2 \times 10^{-4}$ Pa. Thereafter, the base material subjected to the pre-treatment was heated to 400° C. An aluminum fluoride sintered body material was used as a vapor deposition material, the sintered body material was irradiated with electron beams, and then a shutter was opened, so that an aluminum fluoride layer having a thickness of 1.1 μm was formed on the base material subjected to the pre-treatment. The electron beam input power at this time was about 40 mA at an acceleration voltage of 5 kV, the degree of vacuum in the vapor deposition was set to $5 \times 10^{-4}$ Pa, and the treatment time was set to 120 sec.

Comparative Example 2

The base material was first subjected to pre-treatment, vacuum deposition was performed as described below to form a magnesium fluoride layer on the surface of the base material, and further vacuum deposition was performed to form an aluminum fluoride layer on the magnesium fluoride layer to give a corrosion-resistant member. The kinds of the metals constituting the base material and the contents of the pre-treatment to the base material are the same as those in Example 1.

The conditions of the vacuum deposition in forming the magnesium fluoride layer are as follows. First, the base material subjected to the pre-treatment was installed in a vacuum chamber, and then the inside of the vacuum chamber was evacuated until the degree of vacuum reached $2 \times 10^{-4}$ Pa. Thereafter, the base material subjected to the pre-treatment was heated to 380° C. A magnesium fluoride sintered body material was used as a vapor deposition material, the sintered body material was irradiated with electron beams, and then a shutter was opened, so that a magnesium fluoride layer having a thickness of 0.5 μm was formed on the base material subjected to the pre-treatment. The electron beam input power at this time was about 40 mA at an acceleration voltage of 5 kV and the degree of vacuum in the vapor deposition was set to $5 \times 10^{-4}$ Pa.

The conditions of the vacuum deposition in forming the aluminum fluoride layer are as follows. First, the base material on which the magnesium fluoride layer was formed was installed in a vacuum chamber, and then the inside of the vacuum chamber was evacuated until the degree of vacuum reached $2 \times 10^{-4}$ Pa. Thereafter, the base material on which the magnesium fluoride layer was formed was heated to 400° C. An aluminum fluoride sintered body material was used as a vapor deposition material, the sintered body material was irradiated with electron beams, and then a shutter was opened, so that an aluminum fluoride layer having a thickness of 1.1 μm was formed on the magnesium fluoride layer on the base material heated to 400° C. The electron beam input power at this time was about 40 mA at an acceleration voltage of 5 kV and the degree of vacuum in the vapor deposition was set to $5 \times 10^{-4}$ Pa.

The obtained corrosion-resistant member in Comparative Example 2 does not have the first crystalline region in the aluminum fluoride layer and the aluminum fluoride layer is composed of only the second crystalline region. The obtained corrosion-resistant member in Comparative Example 2 was evaluated in the same manner as in Example 1. The results are shown in Table 1.

Comparative Example 3

A corrosion-resistant member was manufactured and evaluated in the same manner as in Comparative Example 1, except that the metal constituting the base material was changed to an aluminum alloy A6061 containing 1.02% by mass of magnesium. The results are shown in Table 1.

Comparative Example 4

A corrosion-resistant member was manufactured and evaluated in the same manner as in Comparative Example 2, except that the metal constituting the base material was changed to an aluminum alloy A6061 containing 1.02% by mass of magnesium. The results are shown in Table 1.

As is understood from Table 1, in the corrosion-resistant members in Examples 1 to 6, the peeling of the corrosion-resistant coating hardly occurred even when subjected to a thermal history by the heating test.

In contrast thereto, in the corrosion-resistant members in Comparative Examples 2, 4 not having the first crystalline region in the aluminum fluoride layer, the peeling of the corrosion-resistant coating occurred by the heating test in which the temperature was repeatedly raised and lowered. In the corrosion-resistant members in Comparative Examples 1, 3 not having the first crystalline region in the aluminum fluoride layer and not having the magnesium fluoride layer, the peeling of the corrosion-resistant coating occurred by the heating test in which the temperature was repeatedly raised and lowered, and the degree of the peeling was larger than that in the corrosion-resistant members in Comparative Examples 2, 4.

REFERENCE SIGNS LIST

10 base material
30 corrosion-resistant coating
31 magnesium fluoride layer
32 aluminum fluoride layer
32A first crystalline region
32B second crystalline region

The invention claimed is:
1. A corrosion-resistant member comprising:
   a metal base material; and
   a corrosion-resistant coating formed on a surface of the base material, wherein
   the corrosion-resistant coating is a stack of a magnesium fluoride layer containing magnesium fluoride and an aluminum fluoride layer containing aluminum fluoride in order from a side of the base material,
   the aluminum fluoride layer has a first crystalline region and a second crystalline region containing crystalline aluminum fluoride,
   a ratio of a thickness of the first crystalline region to a thickness of the aluminum fluoride layer is 15% or more and 95% or less,
   the first crystalline region is a region in which diffraction spot arrays having regularity are observed in an electron beam diffraction image obtained by irradiation with electron beams having a beam diameter of 10 nm or more and 20 nm or less, and the second crystalline region is a region in which a plurality of diffraction spots is observed but diffraction spot arrays having regularity are not observed in an electron beam diffraction image obtained by irradiation with the electron beams.

2. The corrosion-resistant member according to claim 1, wherein the first crystalline region is arranged adjacent to or close to the magnesium fluoride layer.

3. The corrosion-resistant member according to claim 1, wherein the metal base material is formed of aluminum or an aluminum alloy.

4. The corrosion-resistant member according to claim 1, wherein a thickness of the magnesium fluoride layer is 0.1 µm or more and 20 µm or less.

5. The corrosion-resistant member according to claim 1, wherein a thickness of the aluminum fluoride layer is 0.2 µm or more and 50 µm or less.

6. The corrosion-resistant member according to claim 2, wherein the metal base material is formed of aluminum or an aluminum alloy.

7. The corrosion-resistant member according to claim 2, wherein a thickness of the magnesium fluoride layer is 0.1 µm or more and 20 µm or less.

8. The corrosion-resistant member according to claim 3, wherein a thickness of the magnesium fluoride layer is 0.1 µm or more and 20 µm or less.

9. The corrosion-resistant member according to claim 2, wherein a thickness of the aluminum fluoride layer is 0.2 µm or more and 50 µm or less.

10. The corrosion-resistant member according to claim 3, wherein a thickness of the aluminum fluoride layer is 0.2 µm or more and 50 µm or less.

11. The corrosion-resistant member according to claim 4, wherein a thickness of the aluminum fluoride layer is 0.2 µm or more and 50 µm or less.

* * * * *